United States Patent
Lee et al.

(10) Patent No.: US 8,659,890 B2
(45) Date of Patent: Feb. 25, 2014

(54) EUSB DUPLICATION SYSTEM

(76) Inventors: Jon Lee, City of Industry, CA (US);
Jeffrey Yao, City of Industry, CA (US);
Anthony Xinghua Zhang, City of Industry, CA (US)

( * ) Notice: Subject to any disclaimer, the term of this patent is extended or adjusted under 35 U.S.C. 154(b) by 290 days.

(21) Appl. No.: 13/099,886

(22) Filed: May 3, 2011

(65) Prior Publication Data

US 2012/0281347 A1    Nov. 8, 2012

(51) Int. Cl.
*G06F 1/16* (2006.01)
*H05K 5/00* (2006.01)
*H05K 7/00* (2006.01)

(52) U.S. Cl.
USPC ................................. 361/679.45; 361/679.01

(58) Field of Classification Search
USPC .............. 361/679.1, 679.45, 724–727, 679.4, 361/728–731, 733, 103
See application file for complete search history.

(56) References Cited

U.S. PATENT DOCUMENTS

| | | | | |
|---|---|---|---|---|
| 5,796,684 A * | 8/1998 | Yaegashi | ....................... | 709/230 |
| 6,563,714 B2 * | 5/2003 | Chang | ........................... | 361/752 |
| 6,957,291 B2 * | 10/2005 | Moon et al. | ................... | 710/302 |
| 7,850,082 B1 * | 12/2010 | Chow et al. | ................... | 235/451 |
| 2006/0218434 A1 * | 9/2006 | Solhjell | ............................ | 714/6 |
| 2008/0005393 A1 * | 1/2008 | Wang et al. | .................... | 710/33 |
| 2011/0182020 A1 * | 7/2011 | Sato | ........................ | 361/679.31 |
| 2012/0281347 A1 * | 11/2012 | Lee et al. | ................. | 361/679.31 |

* cited by examiner

*Primary Examiner* — Bernard Rojas
(74) *Attorney, Agent, or Firm* — Clement Cheng

(57) ABSTRACT

An eUSB duplication system allows for digital data copy from a master eUSB storage device to target eUSB storage devices and includes a duplicator chassis with multiple sockets capable of receiving installation of multiple standard 5.25 inch optical disc drives. A controller is secured in a tray-shaped frame with overall dimensions of one 5.25 inch optical disc drive. An electronic circuit is mechanically secured within the controller and includes a digital logic circuit for reading digital data from one eUSB storage device and writing the read digital data to other eUSB storage devices. Multiple eUSB decks through which eUSB storage devices can be connected to the eUSB duplication system.

10 Claims, 8 Drawing Sheets

EUSB DUPLICATION SYSTEM

FIELD OF THE INVENTION

The present invention relates generally to the embedded USB ("eUSB") used in industry computers and embedded storage devices, and more particularly, relates to the system for duplication of digital data stored on such eUSB storage device.

DISCUSSION OF RELATED ART

Solid state memory is commonly used in computer equipment. A variety of different standards have been implemented for solid-state memory including eUSB which is a rugged, reliable, cost-effective, and small digital storage device that is designed to provide a better solution in embedded data storage than hard disk drive (HDD), for many reasons. With no moving parts, the reliability of eUSBs surpasses many of the best-in-class HDDs.

Solid state memory withstands extreme shock and vibrations and has a wider operating temperature range than competing technologies, ensuring higher reliability in demanding environments. Smaller than an 1.8-inch HDD, eUSB can be packed with more features into less space. It costs less to implement than even the least expensive HDDs, and also draws less than 330 mW of power when actively reading or writing data. eUSB enables faster boot-up (access time) than many HDDs, and the USB interface is already defined in most boot sequencers. eUSB stores voluminous amounts of information at an affordable cost. Consequently, the amount of data stored on such devices, in variant forms of computer program, increases continuously.

Frequently, a purchaser of new industry computers receives a significant number of computer programs pre-recorded on eUSB storage device included in the computers. Pre-loading such software programs onto an eUSB storage device, from distribution media like CD or DVD, is time consuming. Therefore, prior to delivering such industry computers, assembling such computer systems require various techniques to either automate, as much as possible, software installation, or they merely copying software recorded on an eUSB storage device installed in one computer onto an eUSB storage device installed in the new computer. Either of these techniques for duplication digital data present on an eUSB storage device is relatively inefficient and cumbersome. Consequently, an apparently mundane task of copying a voluminous amount of digital data from one eUSB storage device to another eUSB storage device actually requires a significant amount of advance planning and procurement to insure availability of all necessary hardware followed by a significant amount of time and attention during digital data duplication. The current Disc On Module ("DOM") memory card duplicator allows duplication but is dedicated for DOM memory card with 40-pin or 44-pin, and not applicable to eUSB storage device which normally has 9 pins or 10 pins.

SUMMARY OF THE INVENTION

An eUSB duplication system is designed for digital data copy between embedded USB ("eUSB") storage devices. Here USB stands for universal serial bus. The eUSB duplication system is built in a chassis with the space that can mount multiple standard 5.25 inch devices such as optical disc drives. The electronic circuit includes a digital logic circuit for reading digital data from one eUSB storage device and writing the read digital data to one or more other eUSB storage devices. A liquid crystal display ("LCD") with 4-key button switches permits an operator to control the eUSB duplication system.

Briefly, the present invention is an eUSB duplication system for copying digital data from one eUSB storage device to one or multiple other eUSB storage devices that are mounted in a chassis with the space sized to install several standard 5.25 inch devices such as optical disc drives which have a width of 5.25 inches. The eUSB duplication system includes a controller secured in a tray-shaped frame with opposing side walls that are spanned at one end by a front panel. The controller frame side walls respectively include means for mechanically securing the controller into the eUSB duplicator chassis. The eUSB duplication system includes an electronic circuit that is mechanically secured within the controller. The electronic circuit includes an electrical-power connector for supplying electrical power to the electronic circuit. The electronic circuit includes multiple eUSB storage device connectors. The electronic circuit also includes a digital logic circuit for reading digital data from one eUSB storage device and writing the read digital data to other eUSB storage devices. The electronic circuit also includes a plurality of switches, located adjacent to the front panel of the chassis, which permit operator control of the digital logic circuit for reading data from one eUSB storage device and writing the read data to other eUSB storage devices.

To connect eUSB storage devices to the eUSB duplication system, the eUSB duplication system further includes an eUSB deck, which can transfer the digital data information between eUSB storage device and the digital logical circuit. The eUSB storage device has the interface of 9-pin connector. The eUSB duplication system also includes a display, such as a liquid crystal display ("LCD") that is coupled to the electronic circuit. The display, which is visible through the front panel of the chassis, presents a visible status indicating operation of the eUSB duplication system for copying data from one eUSB storage device to another eUSB storage device. Preferably, the USB storage device connectors permit coupling eUSB decks and eUSB storage devices which conform to the same interface specifications to the electronic circuit.

An eUSB duplication system allows for digital data copy from a master eUSB storage device to target eUSB storage devices and includes a duplicator chassis with multiple sockets for receiving installation of multiple 5.25 inch devices. A controller is secured in a tray-shaped frame with overall dimensions of one 5.25 inch device. An electronic circuit is mechanically secured within the controller and includes a digital logic circuit for reading digital data from one eUSB storage device and writing the read digital data to other eUSB storage devices. Multiple eUSB decks through which eUSB storage devices can be connected to the eUSB duplication system.

The duplicator chassis further includes a power supply which is located in the rear of chassis to provide power electricity to the eUSB duplication system, including the controller and eUSB decks; a power switch button in the front of duplicator chassis, to turn on and turn off the eUSB duplication system; a fan in the rear of chassis to suck internal air flow out of duplicator chassis in order to cool down the eUSB duplication system when it is running; and two opposing sides walls with means for mechanically securing the controller and eUSB decks within the duplicator chassis.

Optionally, the controller is physically secured in a tray shaped frame with opposing side walls that are spanned at one end by a front panel, wherein the trayshaped frame has overall dimensions of one 5.25 inch optical disc drive, wherein side walls respectively include means for mechanically securing the controller within the duplicator chassis, wherein four button switches are mounted on the front panel of the controller frame which for an operator to control the eUSB duplication system; and further comprising a display which is visible through the front panel of the controller for indicating operation status of the eUSB duplication system for copying digital data from a master eUSB storage device to target eUSB storage devices.

The four button switches are preferably membrane switch buttons. The display is a liquid crystal display ("LCD"), and the front panel of the controller frame has an LCD aperture formed there through which the LCD is visible. The electronic circuit includes a printed circuit board ("PCB") which is mounted on the controller frame, and an electrical-power connector for supplying electrical power to the electronic circuit. The electronic circuit also includes eUSB storage device connectors which couple the eUSB storage devices to the electronic circuit, and connectors for input/output information from or to the four-button membrane switches. The electronic circuit also has an LCD display, and a digital logic circuit for reading digital data from one eUSB storage device and writing the read digital data to other eUSB storage devices.

In the first eUSB storage device connector permits coupling to the electronic circuit of the first eUSB deck which supports a total of four eUSB storage devices. Other storage device connectors provide coupling to the electronic circuit of multiple other eUSB decks and eUSB storage devices that conform to the same interface specification. The interface specifications are the same as the Universal Serial Bus ("USB") specification.

The digital logic circuit includes a central processing unit ("CPU") that executes computer program for copying digital data from the first eUSB storage device to multiple other eUSB storage devices, a read only memory ("ROM") for storing the computer program executed by the CPU, and random access memory ("RAM") for storing digital data read from the first eUSB storage device, and supplying such digital data for writing to several other eUSB storage devices.

The eUSB deck sends read or write digital data from or to a connected eUSB storage device. The eUSB deck is connected to the USB storage device connector on the controller by cable. A total of four ports are dispose on each eUSB deck for plugging in an eUSB storage device, so that the number of eUSB decks used is scalable.

The eUSB deck has two light-emitting diode ("LED") lights for each eUSB port, one being red and the other being green. The two LED lights are used for indicting the status of copy process, where the green light continuously flashes during a normal copy process and stops after a successful copy, and where the red light only lights if the copy process fails.

An object of the present invention is to provide a system for efficiently copying voluminous amounts of digital data from one eUSB storage device to another eUSB storage device. Another object of the present invention is to provide a physically compact system for copying voluminous amounts of digital data from one eUSB storage device to another eUSB storage device. Another object of the present invention is to provide a simple system for copying voluminous amounts of digital data from one eUSB storage device to another eUSB storage device. Another object of the present invention is to provide a flexible system for copying voluminous amounts of digital data from one eUSB storage device to another eUSB storage device. Another object of the present invention is to provide a facile system for copying voluminous amounts of digital data from one eUSB storage device to another eUSB storage device.

These features, objects and advantages are apparent and will be understood to those of ordinary skill in the art from the following detailed description of the preferred embodiment as illustrated in the various drawing.

The following call out list of elements is a useful guide in referencing the elements of the drawings.

1 EUSB Duplication System
6 Chassis
8 Power Switch Button
9 Two Opposing Side Walls
10 Power Supply
11 Output
12 Fan
20 Posts
21 Controller
22 Frame
23 Two Opposing Side Walls
24 Front Panel
25 Screws
26 Threaded Apertures
27 Bottom Wall
28 Plastic Plate
29 Rectangular Openings
30 Electronic Circuit
31 Printed Circuit Board (PCB)
32 Electrical-Power Connector
34 Daisy Chain Connectors
36 LED Connector
38 EUSB Storage Device Connectors
50 Multiple EUSB Decks
52 Front Panel
53 Two Opposing Side Walls
54 Tray-Shaped Chassis
62 Random Access Memory (RAM)
66 SATA-To-USB Bridge Chipset
68 CPU
69 Read Only Memory (ROM)
70 Printed Circuit Board (PCB)
76 EUSB Storage Device Connector
76a First EUSB Storage Device Connector
76b Second EUSB Storage Device Connector
77 Electronic Circuit
78 LED
79 Opening Window Slot
86 Input/Output Connector
87 Cable
88 LCD 89 Four Operational Buttons
89a. First Pushbutton
89b. Second Pushbutton
89c. Third Pushbutton
89d. Fourth Pushbutton
90 Liquid Crystal Display (LCD)
92 Cable
94 Connector
95 Controller Connector
96 Cable
97 First End
98 Second Connector

DETAILED DESCRIPTION OF THE PREFERRED EMBODIMENT

Figure 1:
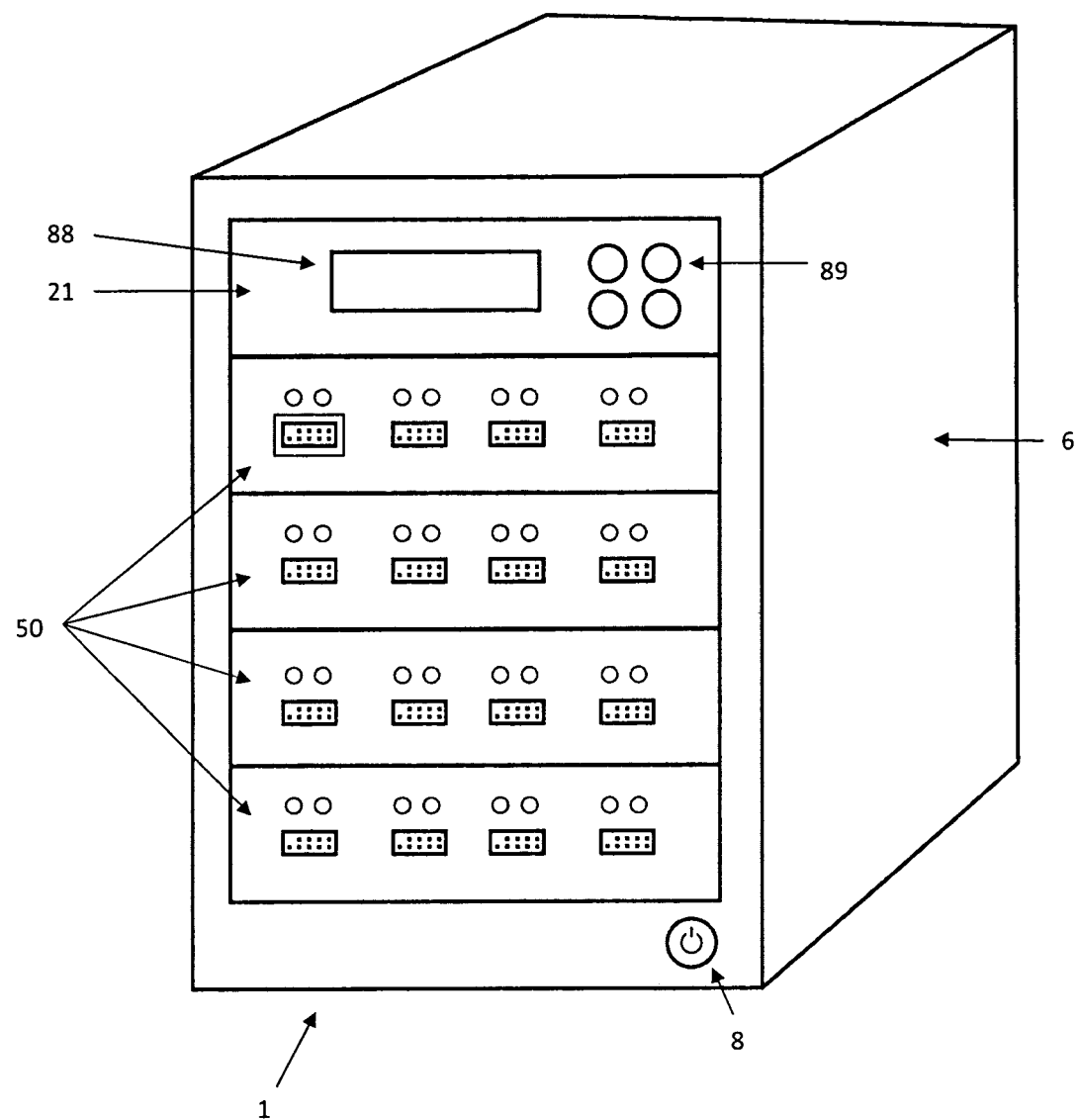
FIG. 1 is a perspective view of a eUSB duplication system in accordance with the present invention.

FIG. 1 depicts an eUSB duplication system in accordance with the present invention referred to by the general reference number 1. The eUSB duplication system 1 includes a chassis 6 which has a power switch button 8, a controller 21 with four operational buttons 89 and a LCD 88 for status display, multiple eUSB decks 50 for connecting eUSB storage devices.

Figure 2:
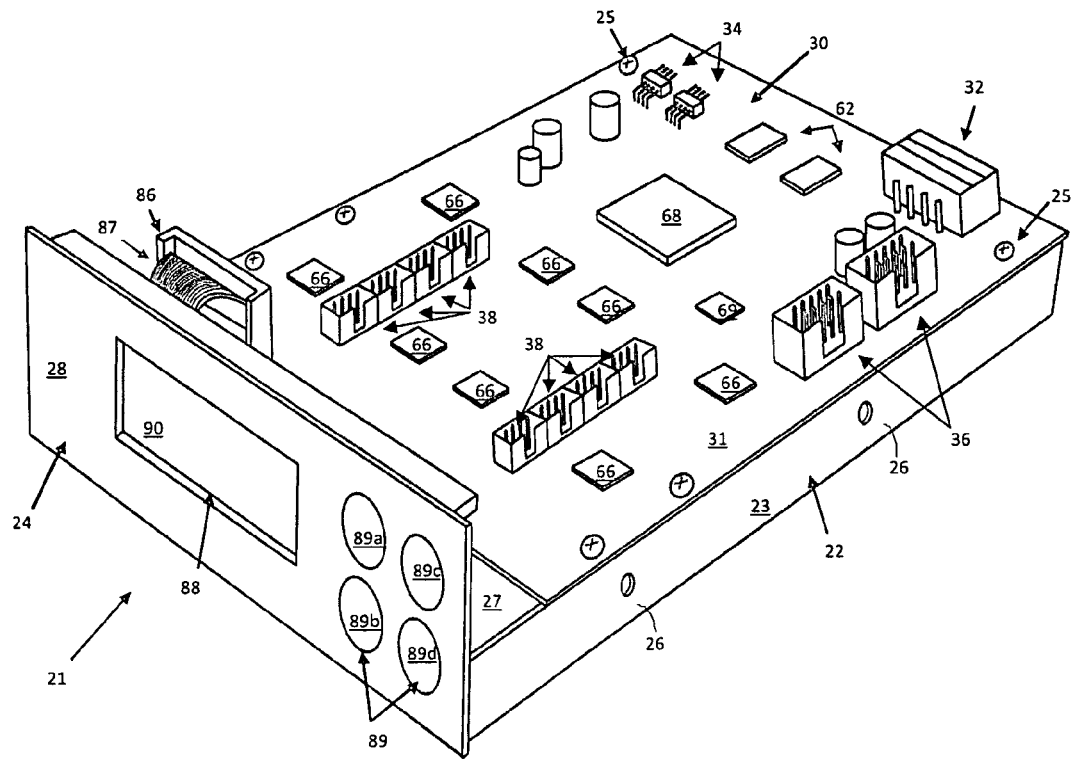
FIG. 2 is a perspective view depicting the controller of eUSB duplication system of FIG. 1 including the PCB and the U-shaped controller frame.

FIG. 2 depicts the controller 21 of eUSB duplication system 1. Controller 21 includes a tray shaped frame 22, which has a bottom wall 27, two opposing side walls 23, and a front panel 24. Side walls 23 and front panel 24 project upward from the bottom wall 27. The controller 21 has overall dimensions, i.e. length, width and height, the same as overall dimensions of a standard size, 5.25 inch optical disc drive. The side walls 23 respectively include threaded apertures 26 for mechanically securing the controller 21 within the duplicator chassis 6.

The controller 21 includes an electronic circuit 30, preferably assembled on a printed circuit board ("PCB") 31. The PCB 31 is mechanically secured within the frame 22 by screws 25 on a plurality of posts that project upward from the bottom wall 27. The electronic circuit 30 includes an electrical-power connector 32, which is connected to the output 11 of power supply 10 in the duplicator chassis 6 (illustrated in FIG. 5) for supplying electrical power to the electronic circuit 30. The electronic circuit 30 also includes multiple eUSB storage device connectors 38 with 4 male pins each. Each of the USB storage device connectors 38 respectively couples an eUSB storage device (not depicted in any of the Figs.) to the electronic circuit 30. The electronic circuit 30 also includes a digital logic circuit illustrated in FIG. 8.

As illustrated in FIG. 2, the front panel 24 consists of a rectangular opening window 88. A liquid crystal display ("LCD") 90 is secured to the front panel 24, adjacent to the window 88 providing two-line characters of display. The front panel 24 of the chassis 22 includes an overlay of plastic plate 28 with four membrane push-buttons 89, namely the first pushbutton 89a, the second pushbutton 89b, the third pushbutton 89c, and the fourth pushbutton 89d. This plastic plate 28 has a transparent area with the same size as window 88, which allows LCD 90 to be visible. There is an input/output connector 86 on the electronic circuit 30, which is connected to the LCD 90 and membrane push-buttons 89 through cable 87. This input/output connector is also coupled to the CPU 68, it will pass the instructions from operator who pressing on the push-buttons 89 to the CPU 68, and also output operation status to the LCD 90 for display. Information presented on the LCD 90 is the status of the computer program executed by the CPU 68, it is related to the operation of the eUSB duplication system 1 for copying digital data between eUSB storage devices, and is visible to an operator through the window 88.

An operator of the eUSB duplication system 1 may initiate duplication of digital data stored in eUSB storage device by appropriately pressing the push-buttons 89, namely a first pushbutton 89a, a second pushbutton 89b, a third pushbutton 89c, and a fourth pushbutton 89d). Pressing the first pushbutton 89a or second pushbutton 89b, causes the computer program to step through entries in a selection menu which the computer program presents on the LCD 90. When a desired menu entry appears on the LCD 90, the operator presses the third pushbutton 89c to select that menu entry. Pressing the fourth pushbutton 89d will exit from current entry back to a higher level entry. After the eUSB duplication system 1 starts digital data duplication, the computer program executed by the CPU 68 will present status information about the copying process on the LCD 90.

The eUSB storage-device connectors 38 permit coupling eUSB deck 50 (illustrated in FIG. 4) to the eUSB duplication system 1. Up to two (2) eUSB decks 50, which conform to the same specification, can be connected to one PCB 31 of controller 21 through USB storage-device connectors 38. Multiple PCB 31 can be daisy chained together by connectors 34. One connector 34 links to previous PCB 31, and the other connector 34 links to next PCB 31. The more PCB are linked, more eUSB decks can be installed and therefore more eUSB storage devices can be duplicated. The eUSB duplication system 1 may copy digital data from the first eUSB storage device coupled to the first eUSB deck 50, to any other eUSB storage devices concurrently.

Electronic circuit 30 also includes SATA-to-USB bridge chipset 66 which is used to transfer digital data between SATA and USB format. Each bridge chipset 66 is dedicated to each eUSB storage device connector 38. There are two signal connectors 36 in the electronic circuit 30, which are connected to the light-emitting diode ("LED") 78 on the eUSB deck 50. The CPU is supported by a dedicated bridge chipset 66 to provide parallel processing of copy functions.

To obtain characteristic data from eUSB storage devices, e.g. data storage capacity, which is required for properly reading or writing digital data, the computer program executed by the CPU 68 send request to the eUSB storage devices that plugged into the eUSB decks, to gather their characteristics to the computer program. Analogously, the computer program executed by the CPU 68 scans each USB storage device connector 38 and eUSB deck 50 to determine where and how many eUSB storage devices are concurrently connected to the eUSB duplication system 1. The computer program then uses that information in presenting an operator with a menu that permits selecting the eUSB storage device from which digital data is to be read or written.

Figure 3:
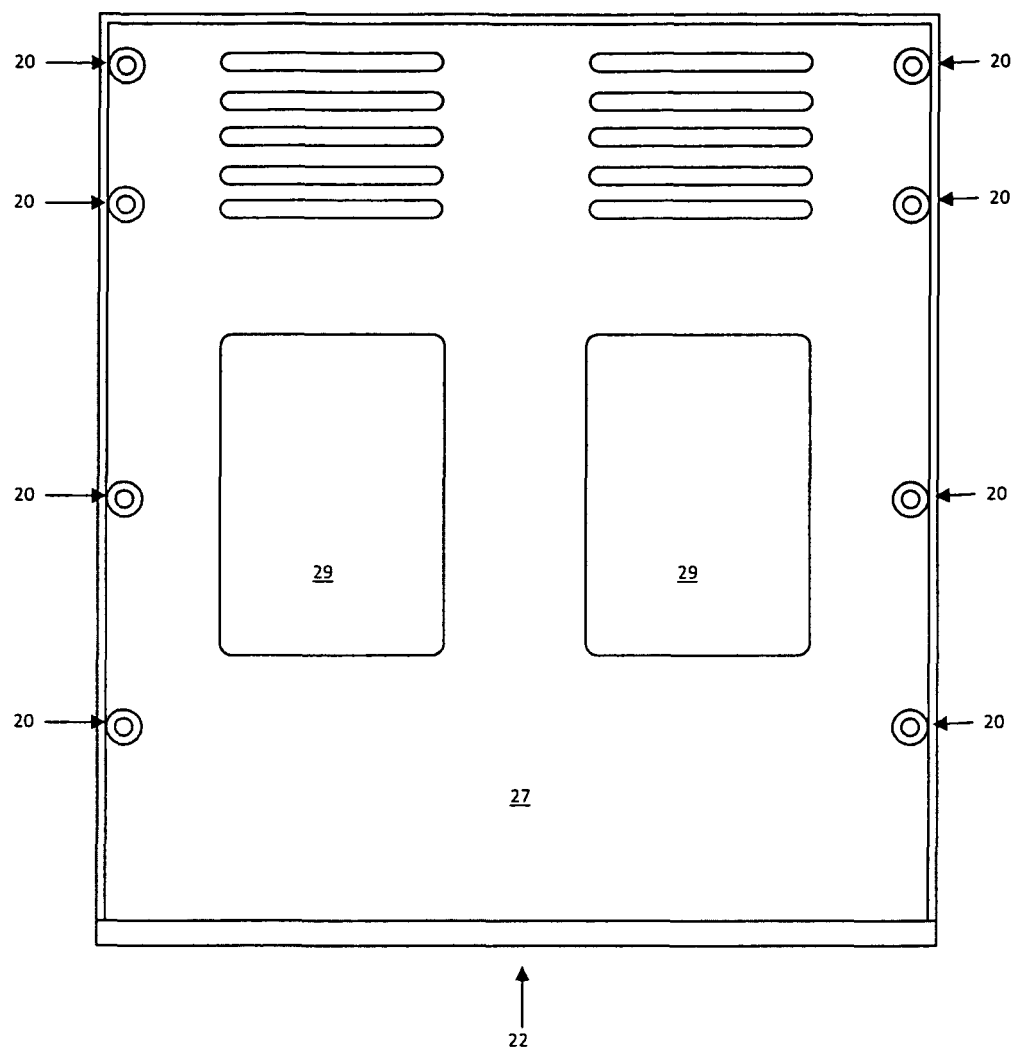
FIG. 3 is a detailed view, depicting the frame bottom of controller in FIG. 2.

FIG. 3 depicts the controller frame 22 from top view. On bottom wall 27, there are two large rectangular openings 29 formed as windows for passing through cables that connect controller to eUSB decks during assembling. A plurality of posts 20 projecting upward from the bottom wall 27, are used to secure controller PCB 31 by screws 25.

Figure 4:
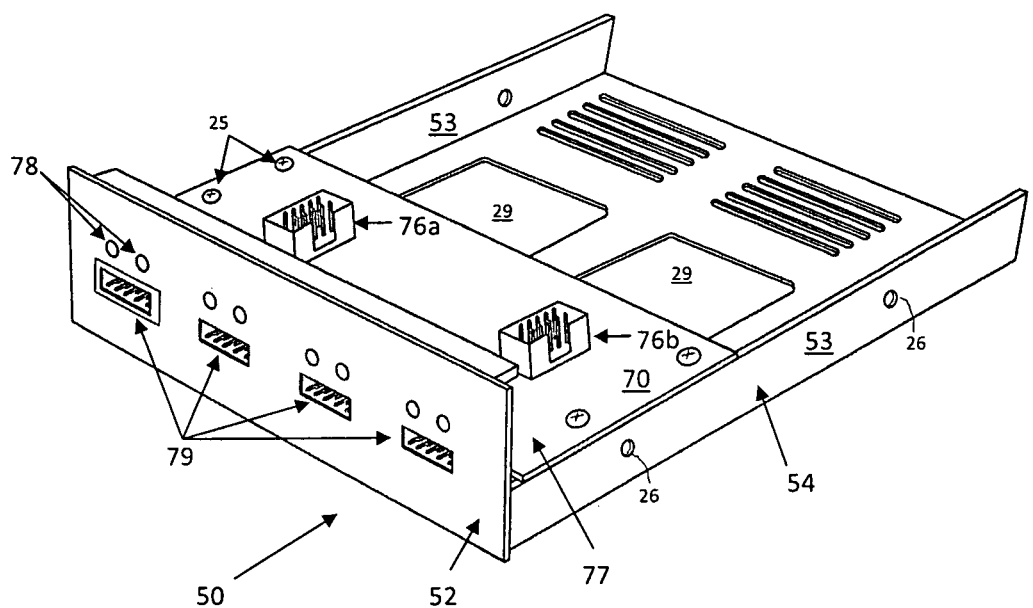
FIG. 4 is a perspective view depicting the eUSB deck of the eUSB duplication system of FIG. 1.

FIG. 4 depicts the eUSB deck 50 of eUSB duplication system 1. The eUSB deck includes a tray-shaped frame 54, which also has two opposing side walls 53, and a front panel 52. The frame 54 has same dimensions of controller frame 22. The side walls 53 respectively include threaded apertures for mechanically securing the eUSB deck 50 within the duplicator chassis 6. The front panel 52 has four (4) ports 79 for inserting eUSB storage devices. Each eUSB port 79 has nine (9) male pins. The front panel 52 also has two (2) LED lights 78 for each port 79, one green color and one red color, total eight (8) LED, indicating the copy status of each eUSB storage device. When the copy process starts the green LED will flash, and will stay stable after copy process finishes. If copy failed, the red LED will be on to give warning signal. All the LED lights 78 are connected to one of the LED connector 36 on PCB 31 of controller 21.

The eUSB deck 50 also includes an electronic circuit 77 assembled on a printed circuit board ("PCB") 70. The PCB 70 is mechanically secured within the frame 54. The electronic circuit 77 includes two eUSB storage device connectors 76, namely a first eUSB storage device connector 76a and a second eUSB storage device connector 76b with ten (10) male pins each. EUSB storage device connectors 76a (same as 76b) is connected to two eUSB storage device connectors 38 on PCB 31 of controller 21 though cable 92 in FIG. 7. eUSB storage device connectors 76a is also connected to the first two eUSB ports 79 on the front panel 52 directly through electronic circuit 77, and 76b is connected to the other two eUSB ports 79.

Figure 5:
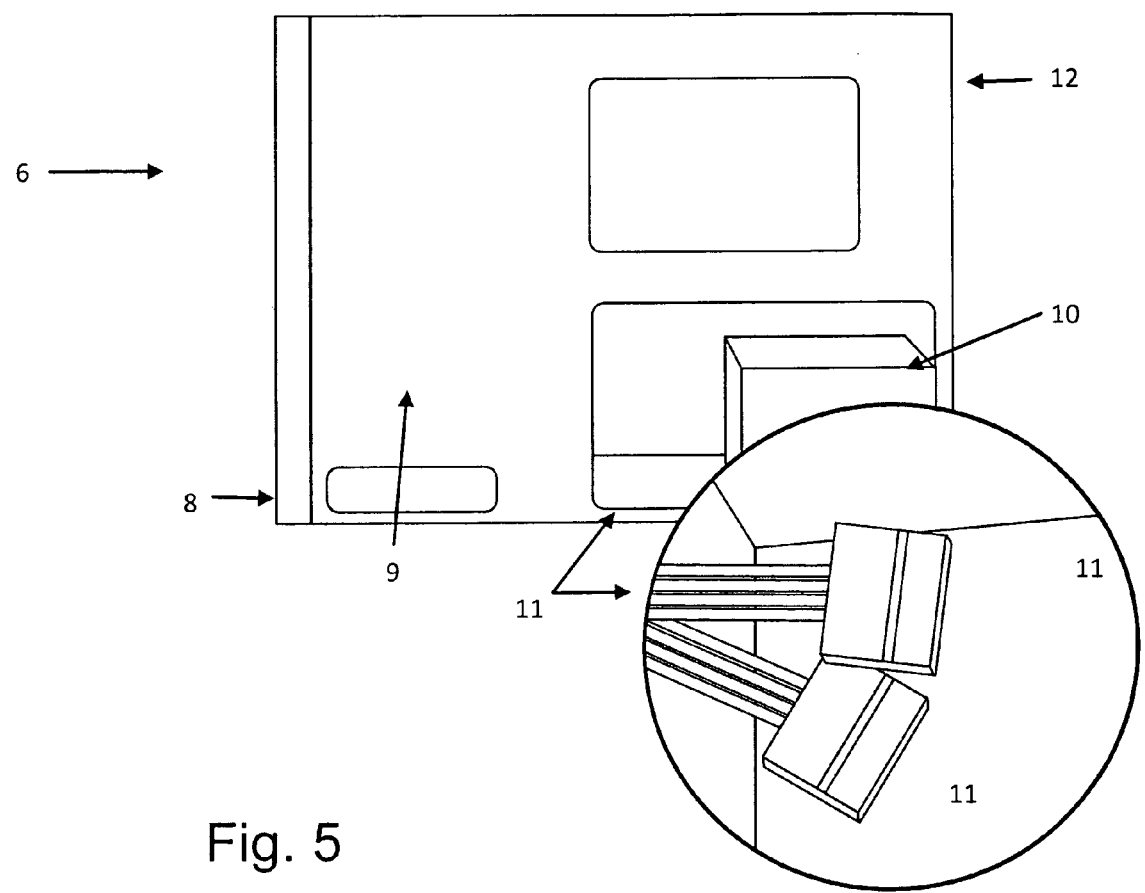
FIG. 5 is a real view of the duplicator chassis of the eUSB duplication system illustrated in FIG. 1.

FIG. 5 is the actual view of duplicator chassis 6 of eUSB duplication system. The duplicator chassis 6 has the space that can install multiple 5.25 inch optical disc drives. It includes a power supply 10 which is located in the rear of chassis 6 to provide electricity to the eUSB duplication system, including the controller and eUSB decks; a power switch button 8 in the front of duplicator chassis, to turn on and turn off the eUSB duplication system; a fan 12 in the rear of chassis to suck internal air flow out of duplicator chassis in order to cool down the eUSB duplication system when it is running; two opposing side walls 9 with means for mechanically securing the controller and eUSB decks within the duplicator chassis 6. Power supply 10 has multiple outputs 11 with fifteen pins power supply connector for SATA devices. The physical implementation of the block diagram of FIG. 5 would be on five dedicated bridge chipsets 66, which are preferably identical in circuit design.

Figure 6:
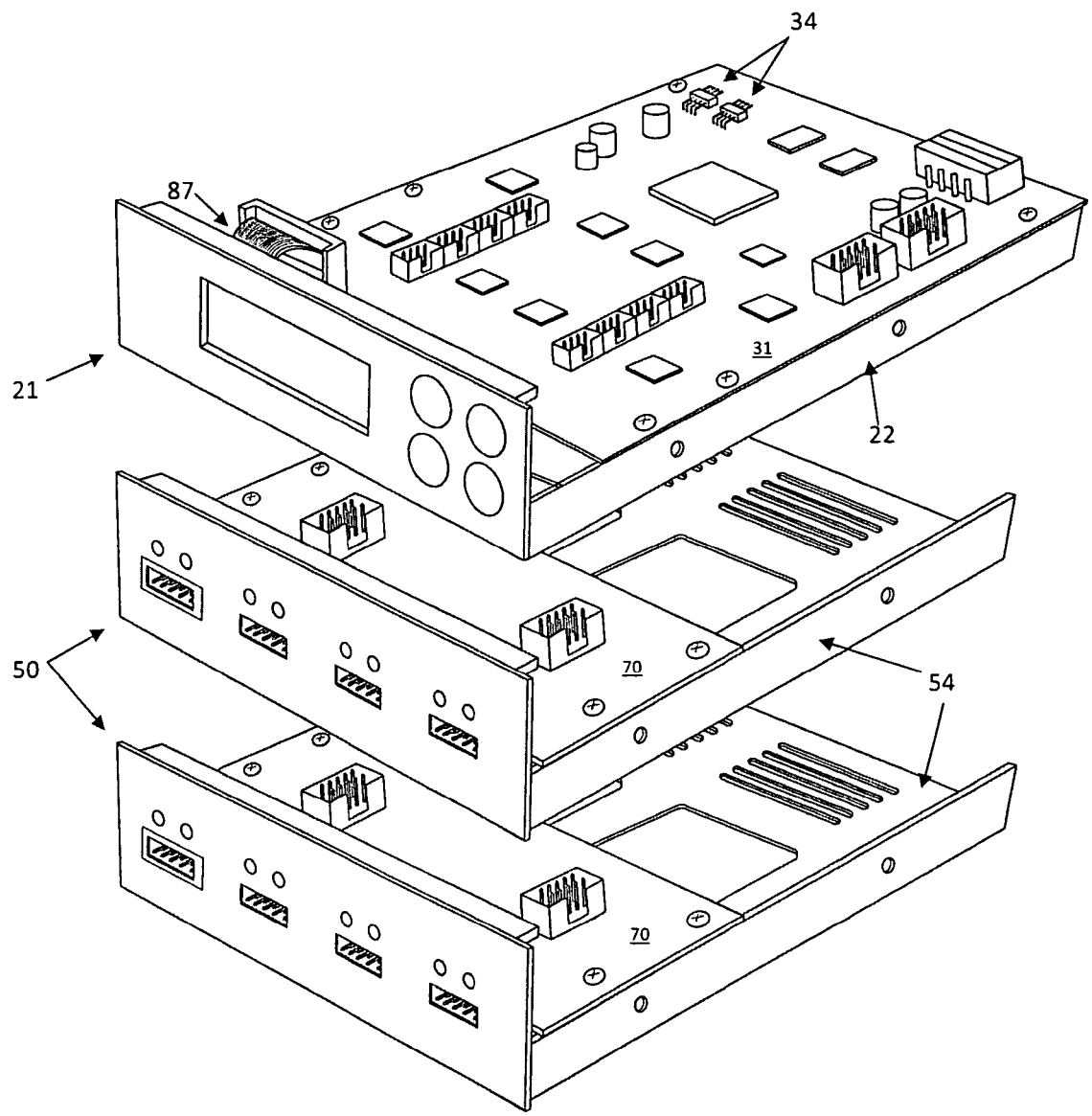
FIG. 6 is the illustration view depicting the positions of controller and eUSB decks.

FIG. 6 depicts the positions of eUSB controller 21 and decks 50 when they are assembled in the eUSB duplicator chassis 6. Normally the PCB 31 of controller 21 is secured on the controller frame 22, and controller 21 is assembled on the top position of chassis 6. eUSB decks 50 are mounted below the controller 21 on the chassis 6. Each PCB 31 of controller 21 can support up to two (2) eUSB decks 50. More eUSB controllers and decks added, more eUSB storage devices can be supported by the duplication system 1. Daisy chain connectors 34 on PCB 31 of controller 21 are used for link multiple controllers. One connector 34 is for connecting previous controller and the other connector for next controller. Alternatively the PCB 31 of controller 21 can be mounted on frame 54 of eUSB deck 50, by doing so an extended cable 87 is needed. When multiple controllers PCB 31 are presented, they normally are mounted on frame 54 of eUSB deck 50 too (both PCB 70 and PCB 31 are mounted on frame 54) in order to save space in duplicator chassis 6.

Figure 7:
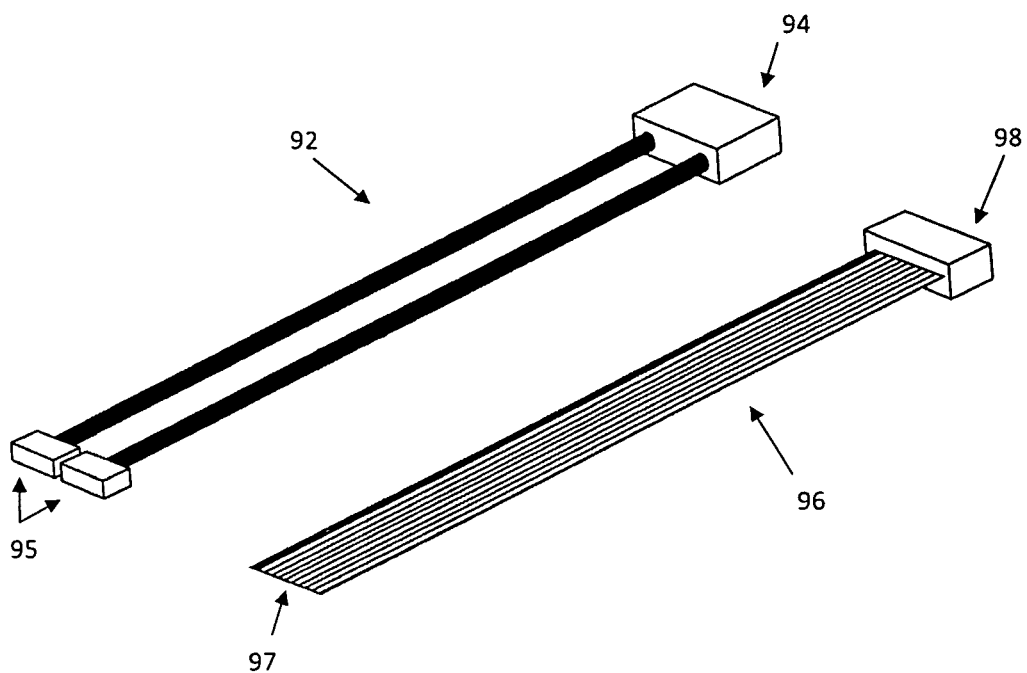
FIG. 7 is the illustration view of cables used to connect controller, eUSB decks, and LED lights.

FIG. 7 depicts the cables used for connecting eUSB controller 21 and decks 50. Cable 92 is data cable for connecting eUSB storage device connector 38 on PCB 31 of controller 21, to eUSB storage device connector 76a and 76b on PCB 70 of eUSB deck 50. Connector 94 of cable 92 has ten (10) female pins that can plug into eUSB storage device connector 76a or 76b on PCB 70 of eUSB deck 50. Controller connector 95 of cable 92 has four (4) female pins that can plug into eUSB storage device connector 38 on PCB 31 of controller 21. Cable 96 is signal cable. A first end 97 of cable 96 is directly soldered onto LED 78 board on the front panel 52 of eUSB deck 50, the second connector 98 has ten (10) female pins that can plug into LED connector 36 on PCB 31 of controller 21.

Figure 8:
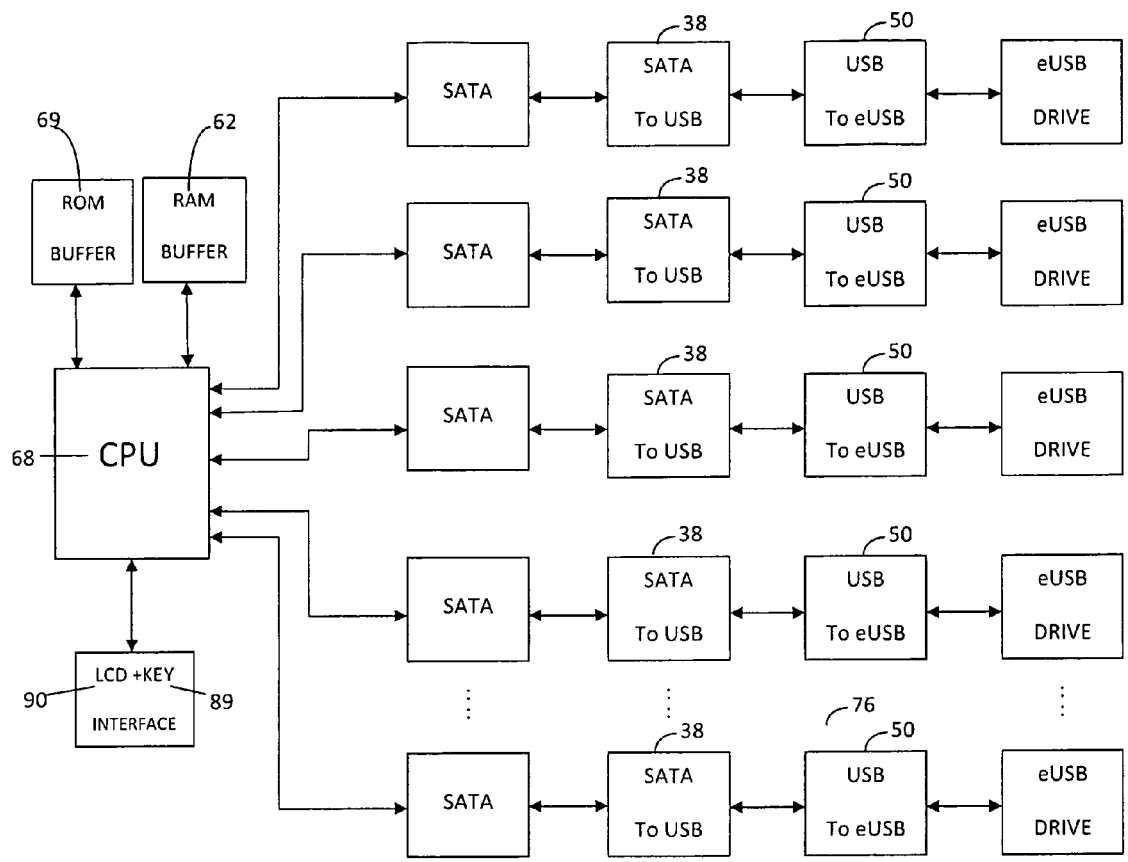
FIG. 8 is a block diagram depicting the digital logical circuit of the eUSB duplication system in FIG. 1.

FIG. 8 depicts the block diagram of digital logical circuit of eUSB duplication system 1. A central processing unit ("CPU") 68 executes a computer program that is stored in a read only memory ("ROM") 69. An operator can give instructions to CPU 68 by pressing on the 4-button membrane switches 89 on the controller 21. Execution of such instructions by the CPU 68 has effect on copying digital data from one eUSB storage device to another eUSB storage device. The execution status of computer program will be displayed on the LCD 90 of controller 21. In copying digital data from one eUSB storage device to another, a random access memory ("RAM") 62 receives digital data read from one eUSB storage device, and supplies such digital data for writing to the other eUSB storage devices. The digital data output from CPU is originally in SATA format, and will be converted to the format in compliance to USB by bridge chipset 38, then converted to eUSB format through eUSB deck 50.

Although the present invention has been described in terms of the presently preferred embodiment, it is to be understood that such disclosure is purely illustrative and is not to be interpreted as any limitation. For example, it is readily apparent that the electronic circuit 30 may include less or more than eight (8) eUSB storage device connectors 38, and more or less eUSB decks 50. It is also readily apparent from FIGS. 1, 2, 4, 5 and 6 that fewer eUSB deck 50 installed would permit assembling a physically more compact eUSB duplication system 1. Consequently, without departing from the spirit and scope of the invention, various alterations, modifications, and/or alternative applications of the invention will, no doubt, be suggested to those skilled in the art after having read the preceding disclosure. Accordingly, it is intended that the claim should be interpreted as encompassing all alterations, modifications, or alternative applications as fall within the true spirit and scope of the invention.

The invention claimed is:

1. A eUSB duplication system for digital data copy from a master eUSB storage device to multiple target eUSB storage devices, wherein the eUSB duplication system comprises:
   a. a duplicator chassis with slots to receive multiple 5.25 inch device;
   b. a controller secured in a tray-shaped frame with overall dimensions of one 5.25 inch device;
   c. an electronic circuit mechanically secured within the controller, including a digital logic circuit for reading digital data from one eUSB storage device and writing the read digital data to other eUSB storage devices, wherein the electronic circuit further comprises at least five dedicated bridge chipsets, wherein the at least five dedicated bridge sets are operating in parallel;
   d. eUSB decks by which eUSB storage devices can be plugged into the eUSB duplicator system, wherein each of the eUSB storage devices are connected to the at least five dedicated bridge chipsets, wherein the duplicator chassis includes a power supply which is located in the rear of chassis to provide power electricity to the eUSB duplicator system, including the controller and eUSB decks; and further comprising:
   e. a power switch button in the front of duplicator chassis, to turn on and turn off the eUSB duplicator system;
   f. a fan in the rear of chassis to suck internal air flow out of duplicator chassis in order to cool down the eUSB duplication system when it is running; and
   g. two opposing sides walls with means for mechanically securing the controller and eUSB decks within the duplicator chassis, wherein the controller is physically secured in a tray-shaped frame with opposing side walls that are spanned at one end by a front panel, the trayshaped frame having overall dimensions of one 5.25 inch optical disc drive, wherein the side walls respectively include means for mechanically securing the controller within the duplicator chassis, and further comprising:

h. four-button switches mounted on the front panel of the controller frame which permit operator to control eUSB duplicator system; and i. a display which is visible through the front panel of the controller, for display indicating operation status of the eUSB duplication system for copying digital data from one eUSB storage device to other eUSB storage devices.

2. The eUSB duplication system of claim 1, wherein the controller is physically secured in a trayshaped frame with opposing side walls that are spanned at one end by a front panel, wherein the trayshaped frame has overall dimensions of one 5.25 inch optical disc drive, wherein side walls respectively include means for mechanically securing the controller within the duplicator chassis, wherein four button switches are mounted on the front panel of the controller frame which for an operator to control the eUSB duplication system; and further comprising a display which is visible through the front panel of the controller for indicating operation status of the eUSB duplication system for copying digital data from a master eUSB storage device to target eUSB storage devices.

3. The eUSB duplication system of claim 2, wherein the four button switches are membrane switch buttons.

4. The eUSB duplication system of claim 2, wherein the display is a liquid crystal display ("LCD"), wherein the front panel of the controller frame has an LCD aperture formed there through which the LCD is visible.

5. The eUSB duplication system of claim 1, wherein the electronic circuit includes a printed circuit board ("PCB") which is mounted on the controller frame, an electrical-power connector for supplying electrical power to the electronic circuit, eUSB storage device connectors for coupling the eUSB storage devices to the electronic circuit, and connectors for input/output information from or to the four-button membrane switches and LCD display, wherein the electronic circuit also includes a digital logic circuit for reading digital data from one eUSB storage device and writing the read digital data to other eUSB storage devices.

6. The eUSB duplication system of claim 5, wherein the first eUSB storage device connector permits coupling to the electronic circuit of the first eUSB deck which supports a total of four eUSB storage devices; wherein other storage device connectors provide coupling to the electronic circuit of multiple other eUSB decks and eUSB storage devices which conform to the same interface specification.

7. The eUSB duplication system of claim 6, wherein the interface specifications are the same as Universal Serial Bus ("USB") specification.

8. The eUSB duplication system of claim 5, wherein the digital logic circuit includes a central processing unit ("CPU") that executes computer program for copying digital data from the first eUSB storage device to multiple other eUSB storage devices, a read only memory ("ROM") for storing the computer program executed by the CPU, and random access memory ("RAM") for storing digital data read from the first eUSB storage device, and supplying such digital data for writing to several other eUSB storage devices.

9. The eUSB duplication system of claim 1, wherein the eUSB deck sends read or write digital data from or to a connected eUSB storage device, wherein the eUSB deck is connected to a USB storage device connector on the controller by cable, and further comprising four ports on each eUSB deck for plugging in eUSB storage device, wherein the number of eUSB decks used is scalable.

10. The eUSB duplication system of claim 1, wherein the eUSB deck sends read or write digital data from or to a connected eUSB storage device, wherein the eUSB deck is connected to a USB storage device connector on the controller by cable, and further comprising four ports on each eUSB deck for plugging in eUSB storage device, wherein the number of eUSB decks used is scalable.

* * * * *